United States Patent
De Santis et al.

(10) Patent No.: US 10,049,038 B2
(45) Date of Patent: Aug. 14, 2018

(54) MEMORY DEVICES WITH REGISTER BANKS STORING ACTUATORS THAT CAUSE OPERATIONS TO BE PERFORMED ON A MEMORY CORE

(71) Applicant: MICRON TECHNOLOGY, INC., Boise, ID (US)

(72) Inventors: Luca De Santis, Avezzano (IT); Pasquale Conenna, Cittaducale (IT)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 14/809,959

(22) Filed: Jul. 27, 2015

(65) Prior Publication Data

US 2015/0331792 A1 Nov. 19, 2015

Related U.S. Application Data (60) Division of application No. 14/170,728, filed on Feb. 3, 2014, now Pat. No. 9,128,894, which is a division of application No. 12/651,827, filed on Jan. 4, 2010, now Pat. No. 8,667,232, which is a continuation of application No. 11/489,778, filed on Jul. 20, 2006, now Pat. No. 7,644,240, which is a division of application No. 10/722,110, filed on Nov. 25, 2003, now Pat. No. 7,272,683.

(30) Foreign Application Priority Data

Jul. 17, 2003 (IT) .............................. RM2003A0354

(51) Int. Cl.
*G06F 12/00* (2006.01)
*G06F 13/00* (2006.01)
*G06F 13/28* (2006.01)
*G06F 12/02* (2006.01)
*G06F 12/0875* (2016.01)
*G06F 13/16* (2006.01)
*G11C 16/10* (2006.01)

(52) U.S. Cl.
CPC ...... *G06F 12/0246* (2013.01); *G06F 12/0875* (2013.01); *G06F 13/16* (2013.01); *G06F 13/1694* (2013.01); *G06F 2212/202* (2013.01); *G06F 2212/452* (2013.01); *G11C 16/10* (2013.01)

(58) Field of Classification Search
CPC .. G06F 12/0246; G06F 12/0875; G06F 13/16; G06F 13/1694; G06F 2212/202; G06F 2212/452; G11C 16/10
USPC ........................................... 711/154
See application file for complete search history.

(56) References Cited

U.S. PATENT DOCUMENTS

| 4,166,289 | A | 8/1979 | Murtha et al. |
| 4,390,947 | A * | 6/1983 | Deshon ................ G06F 13/385 703/25 |
| 4,447,873 | A | 5/1984 | Price et al. |
| 4,689,823 | A | 8/1987 | Wojcik et al. |
| 4,785,393 | A | 11/1988 | Chu et al. |
| 4,878,190 | A | 10/1989 | Darley et al. |

(Continued)

*Primary Examiner* — Sheng-Jen Tsai
(74) *Attorney, Agent, or Firm* — Dicke, Billig & Czaja, PLLC (57) ABSTRACT

A bus controller has a displacer, an arithmetic logic unit coupled to the displacer, and a replacer selectively coupled to the displacer and the arithmetic logic unit.

25 Claims, 5 Drawing Sheets

(56) References Cited

U.S. PATENT DOCUMENTS

| | | | | |
|---|---|---|---|---|
| 4,891,754 A | * | 1/1990 | Boreland | G06F 9/226 712/221 |
| 4,926,312 A | * | 5/1990 | Nukiyama | G06F 9/264 712/219 |
| 5,241,492 A | | 8/1993 | Girardeau, Jr. | |
| 5,481,736 A | | 1/1996 | Schwartz et al. | |
| 5,491,660 A | | 2/1996 | Ashmore, Jr. | |
| 5,509,134 A | | 4/1996 | Fandrich et al. | |
| 5,517,657 A | * | 5/1996 | Rodgers | G06F 9/30101 711/169 |
| 5,544,356 A | | 8/1996 | Robinson et al. | |
| 5,579,278 A | | 11/1996 | McLaury | |
| 5,603,001 A | | 2/1997 | Sukegawa et al. | |
| 5,644,732 A | * | 7/1997 | Davidson | G06F 12/0669 710/104 |
| 5,655,132 A | | 8/1997 | Watson | |
| 5,668,976 A | | 9/1997 | Zook | |
| 5,692,138 A | | 11/1997 | Fandrich et al. | |
| 5,754,567 A | | 5/1998 | Norman | |
| 5,761,103 A | | 6/1998 | Oakland et al. | |
| 5,761,388 A | | 6/1998 | Nomoto et al. | |
| 5,801,977 A | | 9/1998 | Karp et al. | |
| 5,811,862 A | * | 9/1998 | Okugaki | G11C 11/5692 257/336 |
| 5,832,258 A | | 11/1998 | Kluchi et al. | |
| 5,935,240 A | | 8/1999 | Mennemeier et al. | |
| 5,937,423 A | | 8/1999 | Robinson | |
| 5,956,742 A | | 9/1999 | Fandrich et al. | |
| 6,011,546 A | | 1/2000 | Bertram | |
| 6,032,247 A | * | 2/2000 | Asghar | G06F 9/30174 712/203 |
| 6,038,635 A | | 3/2000 | Ideta | |
| 6,085,237 A | * | 7/2000 | Durham | H04L 41/0213 709/221 |
| 6,085,314 A | * | 7/2000 | Asghar | G06F 9/3017 712/207 |
| 6,124,813 A | | 9/2000 | Robertson et al. | |
| 6,199,155 B1 | * | 3/2001 | Kishida | G06F 9/3013 711/2 |
| 6,223,290 B1 | | 4/2001 | Larsen et al. | |
| 6,311,299 B1 | | 10/2001 | Bunker | |
| 6,438,706 B1 | | 8/2002 | Brown | |
| 6,490,197 B1 | | 12/2002 | Fasoli | |
| 6,581,165 B1 | * | 6/2003 | Weintraub | G06F 5/06 710/52 |
| 6,718,504 B1 | | 4/2004 | Coombs et al. | |
| 6,735,661 B2 | | 5/2004 | Gelke et al. | |
| 7,277,506 B1 | | 10/2007 | Pope et al. | |
| 7,941,651 B1 | | 5/2011 | Toll et al. | |
| 8,346,838 B2 | * | 1/2013 | Debes | G06F 9/30014 708/523 |
| 8,667,232 B2 | * | 3/2014 | De Santis | G06F 13/16 711/103 |
| 2002/0013874 A1 | * | 1/2002 | Gelke | G06F 13/4018 710/305 |
| 2002/0052217 A1 | | 5/2002 | Fukuzumi | |
| 2002/0061606 A1 | | 5/2002 | Honma et al. | |
| 2002/0112149 A1 | | 8/2002 | Moyer | |
| 2002/0188820 A1 | | 12/2002 | Taruki | |
| 2003/0037085 A1 | * | 2/2003 | Sandbote | G06F 9/30014 708/490 |
| 2003/0041229 A1 | * | 2/2003 | Sandbote | G06F 9/30032 712/223 |
| 2003/0138098 A1 | | 7/2003 | Cole | |
| 2004/0003168 A1 | * | 1/2004 | Kim | G06F 13/1678 711/103 |
| 2004/0008841 A1 | | 1/2004 | Aoki et al. | |
| 2004/0054875 A1 | | 3/2004 | Segelken | |
| 2005/0015541 A1 | * | 1/2005 | De Santis | G06F 13/16 711/103 |
| 2008/0005454 A1 | | 1/2008 | Yada et al. | |
| 2008/0320454 A1 | | 12/2008 | Suzuki et al. | |

* cited by examiner

MEMORY DEVICES WITH REGISTER BANKS STORING ACTUATORS THAT CAUSE OPERATIONS TO BE PERFORMED ON A MEMORY CORE

RELATED APPLICATIONS

This application is a divisional of U.S. application Ser. No. 14/170,728, filed on Feb. 3, 2014 and issued as U.S. Pat. No. 9,128,894 on Sep. 8, 2015, which is a divisional of U.S. application Ser. No. 12/651,827, filed on Jan. 4, 2010 and issued as U.S. Pat. No. 8,667,232 on Mar. 4, 2014, which is a continuation of U.S. patent application Ser. No. 11/489,778, filed Jul. 20, 2006 and issued as U.S. Pat. No. 7,644,240 on Jan. 5, 2010, which is a divisional of U.S. patent application Ser. No. 10/722,110, filed Nov. 25, 2003 and issued as U.S. Pat. No. 7,272,683 on Sep. 18, 2007, which application claims priority to Italian Patent Application Serial No. RM2003A000354, filed on Jul. 17, 2003, all of which applications are commonly assigned. The entire contents of U.S. application Ser. No. 14/170,728, U.S. application Ser. No. 12/651,827, U.S. patent application Ser. No. 11/489,778, and U.S. patent application Ser. No. 10/722,110 are incorporated herein by reference.

TECHNICAL FIELD OF THE INVENTION

The present invention relates generally to controllers and in particular the present invention relates to memory device controllers.

BACKGROUND OF THE INVENTION

A flash memory device is a type of electrically erasable programmable read-only memory (EEPROM) and is used for nonvolatile storage of data. Flash memory is being increasingly used to store execution codes and data in portable electronic products, such as computer systems.

Flash memory devices are programmed and erased by sequences of operations (or algorithms). A program algorithm normally involves sequentially applying a programming pulse and a program-verify pulse to a set of memory cells of a flash memory device. This is repeated until the set of memory cells is programmed. An erase algorithm typically comprises a pre-programming cycle, an erase cycle, and a soft program cycle. The pre-programming cycle of the erase algorithm puts each memory cell in a programmed state by applying a program pulse to each row of memory cells. The soft program cycle or heal cycle corrects any over-erased memory cells after the erase cycle has been completed by applying a soft program pulse to the over-erased memory cells. This is often referred to as compaction.

A control circuit (or algorithm controller) is used to manage the various steps of program and erase algorithms. For one application, the algorithm controller executes a code stored on the controller and interacts with hardware devices of the flash memory device, such as memory cell address counters, pulse counters, pulse duration counters, or the like, that are external to the algorithm controller for causing the hardware devices to perform various functions. Moreover, the algorithm controller causes hardwired actuators of the memory device that are external to the algorithm controller to send actuator signals to analog voltage generators of the memory device for controlling the voltage generators during program, erase, or compaction operations. The actuator signals also configure switches and control program verify operations. One problem with hardware devices and hard-wired actuators is that many of them are of a fixed design for a particular application and cannot be readily reconfigured or updated for other applications, thereby limiting versatility and reusability of the flash memory device design.

For the reasons stated above, and for other reasons stated below which will become apparent to those skilled in the art upon reading and understanding the present specification, there is a need in the art for alternative algorithm controllers for memory devices, such as flash memory devices.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
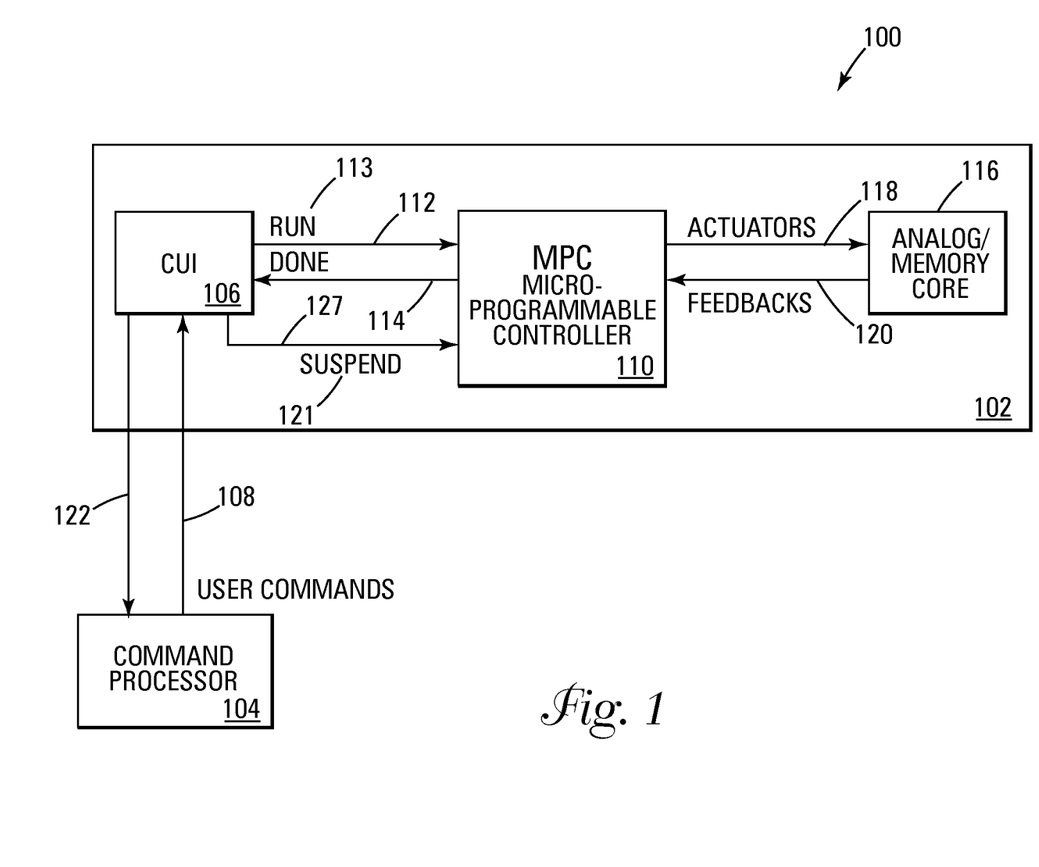
FIG. 1 is a block diagram of a memory system according to an embodiment of the present invention.

FIG. 1 is a block diagram of a memory system 100, such as a flash memory system, according to an embodiment of the present invention. Memory system 100 includes a memory device (or chip) 102, such as a nonvolatile or flash memory device, coupled to a command processor 104 for controlling basic operations of memory device 102. Memory device 102 includes a command user interface (CUI) 106 coupled to a memory device controller (or algorithm controller or micro-programmable controller (MPC)) 110 by control lines 112, 114, and 127. Micro-programmable controller 110 is coupled to an analog/memory core 116 by control lines 118 and 120. For one embodiment, analog/memory core 116 has an array of flash memory cells (not shown) and supporting analog access circuitry (not shown). For another embodiment, the memory cells are floating-gate field-effect transistors, and the supporting access circuitry includes voltage generators for generating voltages, e.g., for programming or erasing the memory cells, various sets of fuses, etc. The memory system has been simplified to focus on features of the memory that are helpful in understanding the invention.

Command user interface 106 decodes signals (or user commands) provided on one or more control lines 108 from command processor 104. Command user interface 106 generates control signals based on the user commands and sends these control signals to micro-programmable controller 110 via control line 112. For one embodiment, these control signals include a run signal (or command) 113 that can include an algorithm command (or signal) that causes micro-programmable controller 110 to perform various algorithms, e.g., for performing program, program-verify, erase, or compaction (recovery of over-erased cells) operations on the memory cells. For another embodiment, when the algorithm is completed, micro-programmable controller 110 sends a DONE signal to command user interface 106 that informs command user interface 106, for example, that an algorithm running on micro-programmable controller 110 has finished and that another run signal 113 can be sent. For some embodiments, the DONE signal indicates whether a particular operation performed by micro-programmable controller 110, such as a program, erase, or compaction operation, has been successful or not.

For some embodiments, the user commands instruct command user interface 106 to send a suspend command (or signal) 121 to micro-programmable controller 110 via control line 127 for suspending execution of a currently running algorithm. For one embodiment, execution is suspended for changing the voltage levels being applied to a memory cell of analog/memory core 116, such as changing from a read voltage to a programming voltage or vice versa. Signals may also be sent from command user interface 106 to command processor 104 over line 122 for monitoring operation of memory device 102. For one embodiment, these signals include information about the status of memory device 102, such as whether memory device 102 is available for read, busy, e.g., running an algorithm, an algorithm is suspended, etc.

For one embodiment, algorithms of micro-programmable controller 110 control timing of actuator (or control) signals sent to analog/memory core 116 of flash memory device 102 via control line 118. For some embodiments, the actuator signals include addresses of memory cells of analog/memory core 116. For other embodiments, micro-programmable controller 110 generates the addresses. For one embodiment, the control signals tell analog/memory core 116 which operation (or mode), such as a program, an erase, a compaction, a program-verify, etc., will be executed. This causes analog/memory core 116 to switch various circuits to the corresponding mode. For one embodiment, the control signals cause one or more voltage circuits to send voltages, e.g., programming voltages, soft-programming voltages, program-verify voltages, etc., for the corresponding mode to the memory cells. For example, control signals may instruct analog circuitry of analog/memory core 116 to apply a programming voltage, soft-programming voltage, program-verify voltage, etc. to the memory cells. For another embodiment, the control signals are transmitted over control line 114 and include the DONE signal.

For another embodiment, feedback signals are sent from analog/memory core 116 over a feedback line 120, e.g., to inform micro-programmable controller 110 whether the memory cells are programmed, erased, need reprogramming, etc. For some embodiments, the feedback signals are sent in response to inquiries sent from micro-programmable controller 110 to analog/memory core 116, e.g., via control lines 118.

Figure 2:
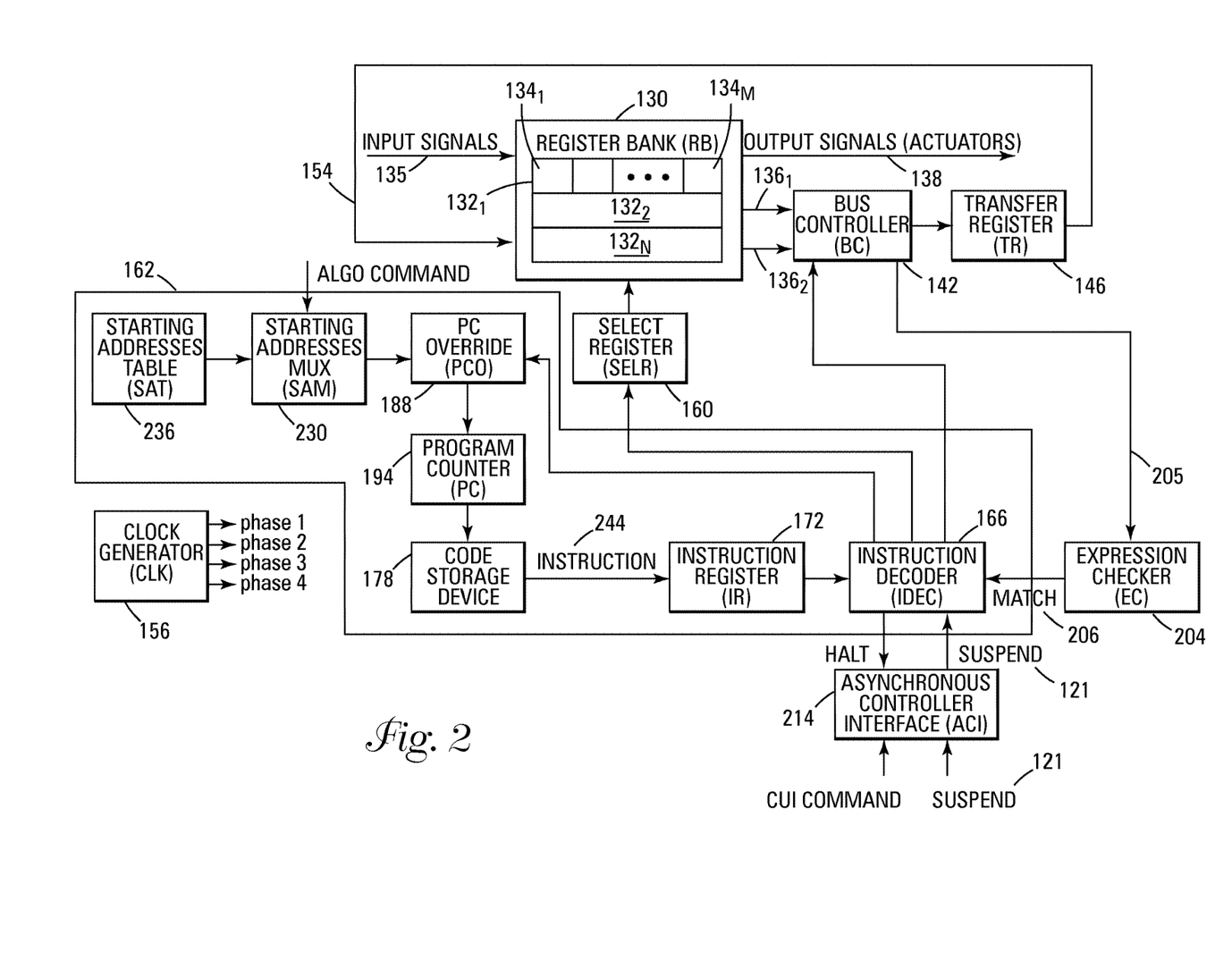
FIG. 2 is a block diagram of a controller for a memory device according to another embodiment of the present invention.

FIG. 2 is a block diagram of micro-programmable controller 110 according to another embodiment of the present invention. Micro-programmable controller 110 includes register bank (RB) 130 having pages $132_1$ to $132_N$. Each of pages 132 includes registers $134_1$ to $134_m$. For one embodiment, M=8, and for another embodiment, each of registers 134 is a 16-bit register. Each register 134 stores internal processing states, input signals received at register bank 130, etc. For some embodiments, the input signals come from various sets of fuses (not shown) of analog/memory core 116 and can include information about the number of programming pulses, the voltage level of the programming pulses, duration of erase or programming cycles, etc. For other embodiments, the input signals include the feedback signals discussed above in conjunction with FIG. 1. For one embodiment, the input signals are received on a bus 135 that for another embodiment includes four 16-bit buses.

Each register 134 can be accessed in a read or write mode. For one embodiment, the content of any one of registers 134 can be output on output buses $136_1$ and $136_2$. For another embodiment, data, e.g., 16-bit data, can be stored in one of registers 134 by addressing the page 132 containing the register 134 using three bits and addressing the register 134 using two bits, i.e., using a total of five bits. For some embodiments, one or more of registers 134 are used to store values of the actuator signals. Register bank 130 transmits the actuator signals to analog/memory core 116. For one embodiment, the actuator signals are output on a bus 138 that for another embodiment includes four 16-bit buses.

For various embodiments, registers 134 include conventional registers, in which data are stored by setting the register, and hardwired registers for receiving the input signals. Registers 134 also include pulsing registers in which data can be updated during each operation cycle of micro-programmable controller 110.

Output buses $136_1$ and $136_2$ couple register bank 130 to a bus controller (BC) 142. Bus controller 142 processes data stored in registers 134 and provides data, e.g., addresses, instructions, etc., to be loaded in registers 134. A transfer register (TR) 146 is coupled for input to bus controller 142. Transfer register 146 is coupled for output to register bank 130 by an input bus 154 that for one embodiment includes three 16-bit buses. Transfer register 146 synchronizes data to be stored in registers 134. That is, transfer register 146 sends the data to registers 134 at a particular time during an operating cycle of micro-programmable controller 110.

Register bank 130 is coupled to a select register (SELR) 160. For one embodiment, select register 160 selects one of registers 134 of one of pages 132 of register bank 130 for register operations, such as data read or write operations. Select register 160 and bus controller 142 are coupled to a processor 162. Specifically, select register 160 and bus controller 142 are coupled to an instruction decoder (IDEC) 166 of processor 162. Instruction decoder 166 is coupled to an instruction register (IR) 172 of processor 162. Instruction register 172 is coupled to a code-storage device 178, such as a read only memory (ROM), of processor 162.

For one embodiment, code-storage device 178 includes an array, e.g., 256 rows by 32 columns, of mask programmable memory cells, such as erasable cells or any other nonvolatile memory cells. Code-storage device 178 contains all of the algorithms of micro-programmable controller 110. These algorithms cause micro-programmable controller 110 to perform program, erase, program-verify, and compaction operations on analog/memory core 116 as well as other operations.

Instruction register 172 receives an instruction from code-storage device 178 and stores the instruction, e.g., for one clock (or operating) cycle of micro-programmable controller 110. Instruction decoder 166 receives the instruction from instruction register 172 and decodes the instruction. In response to some instructions, instruction decoder 166 sends a control signal to select register 160 for causing select register 160 to select one of registers 134 of one of pages 132. For example, a register may be selected to receive input signals from analog/memory core 116 or for outputting actuator signals to analog/memory core 116 or command user interface 106. A register 134 may be selected for sending data to bus controller 142 or receiving data from bus controller 142. The input signals and the data from bus controller 142 update or change the contents of registers 134. For one embodiment, this updates the actuator signals.

For some embodiments, instruction decoder 166 sends a control signal to bus controller 142 for causing to bus controller 142 to perform various data processing operations. For one embodiment, the control signal received at bus controller 142 from instruction decoder 166 includes data. For other embodiments, bus controller 142 sends the data directly to a register 134, processes the data and sends the processed data to a register 134, combines the data with data received from a first of registers 134 and sends the combined data to the first or a second of registers 134, etc.

Instruction decoder 166 is coupled to a program counter over-rider (PCO) 188 of processor 162. Program counter over-rider 188 is coupled to a program counter (PC) 194 of processor 162. Program counter 194 is coupled to code-storage device 178. For one embodiment, program counter over-rider 188 loads program counter 194 with addresses of code-storage device 178 in response to instructions received from instruction decoder 166. For another embodiment, program counter 194 sends the address to code-storage device 178 and increments the address by one.

An expression checker (EC) 204 is coupled to processor 162, and more specifically, to instruction decoder 166. Expression checker (EC) 204 is also coupled to bus controller 142 by a bus 205 for receiving data from bus controller 142. For one embodiment, bus 205 includes two 16-bit buses. For another embodiment, expression checker 204 determines whether the data is all zeros or ones, depending on the type of check being performed. Expression checker 204 sends a match signal 206 to instruction decoder 166 indicating a match when the data is all zeros or all ones, depending on the type of check. Otherwise, the match signal 206 indicates that no match has occurred.

Instruction decoder 166 is coupled to an asynchronous controller interface (ACI) 214. Asynchronous controller interface 214 is coupled to command user interface 106. Asynchronous controller interface 214 receives commands from command user interface 106, such as run command 113, e.g., including an algorithm signal (or command). Asynchronous controller interface 214 can also receive suspend signal (or command) 121 from command processor 104 through command user interface 106 that requests the interrupt of the current operation during algorithm execution by the micro-programmable controller 110. Asynchronous controller interface 214 can receive a halt instruction from instruction decoder 166 when an algorithm is completed. In response to receiving the halt instruction, asynchronous controller interface 214 sends the DONE signal to command user interface 106. Asynchronous controller interface 214 also transmits suspend command 121 to instruction decoder 166.

Program counter over-rider 188 is coupled to a starting address multiplexer (SAM) 230 of processor 162. Starting address multiplexer 230 is coupled to a starting address table (SAT) 236 of processor 162 that contains the initial addresses of all the algorithms stored in code-storage device 178. Starting address multiplexer 230 receives an algorithm command from command user interface 106. The algorithm command causes starting address multiplexer 230 to select a starting address for that algorithm command from starting address table (SAT) 236.

Starting address multiplexer 230 sends the starting address to program counter over-rider 188 that loads the starting address into program counter 194. For one embodiment, program counter 194 sends the starting address to code-storage device 178 and increments the starting address by one. For various embodiments, program counter 194 increments the current address by one in the absence of program counter over-rider 188 receiving a signal from instruction decoder 166 or a starting address from starting address multiplexer 230.

Micro-programmable controller 110 includes a clock generator 156 that for one embodiment has an internal oscillator and for another embodiment has four phases that constitute one operating cycle. For one embodiment, program counter 194 receives phase-1 clock signals from clock generator 156 for enabling program counter 194. During phase 1, program counter 194 is updated and sends an address of code-storage device 178 to code-storage device 178. For another embodiment, code storage device 178 and register bank 130 receive phase-2 clock signals from clock generator 156. During phase 2, code-storage device 178 is enabled, and an instruction 244 stored at the address of code-storage device 178 is sent to instruction register 172 from code-storage device 178. For one embodiment, the input signals from analog/memory core 116 are sampled and stored in one or more of registers 134 during phase 2. Sampling and storing the input signals during a particular phase acts to synchronize micro-programmable controller 110 with the rest of the chip.

Instruction decoder 166, select register 160, transfer register 146, and program counter 194 receive a phase-3 clock signal from clock generator 156. During phase 3, instruction decoder 166 interprets instruction 244. That is, instruction decoder 166 causes micro-programmable controller 110 to perform operations based on instruction 244. For one embodiment, instruction decoder 166 generates a signal depending upon the content of instruction 244. For example, instruction 244 may cause a signal to be sent to select register 160 that causes data to be read from a register 132 of register bank 130 specified in instruction 244 for output. For example, the data can be sent to bus controller 142 or to analog memory core 116. Alternatively, instruction 244 may cause a signal to be sent to select register 160 that causes data to be loaded into a register 132, e.g., from bus controller 142. Instruction 244 may cause a data signal to be sent from instruction decoder 166 to bus controller 142. For one embodiment, bus controller may process the data signal and send it to one of registers 134 for storage. For another embodiment, the data may be combined with data from one of registers 134 and stored in the same or another of registers 134. Instruction 244 may cause instruction decoder 166 to send a halt command to asynchronous controller interface 214 when an algorithm is completed.

Instruction 244 may include alternative instructions. A first of the alternative instructions may cause instruction decoder 166 to send a control signal to program counter over-rider 188 that causes program counter over-rider 188 to cause program counter 194 to increment the present address of code-storage device 178 by one. A second of the alternative instructions causes instruction decoder 166 to send a control signal to program counter over-rider 188 that causes program counter over-rider 188 to cause program counter 194 to be overridden, e.g., for jumping over a number of addresses of code-storage device 178 (or of lines of the algorithm) to a jump address specified in the instruction.

For one embodiment, the first or second alternative is selected according to the match signal 206 received from expression checker 204 at instruction decoder 166. When the match signal 206 indicates that a match has occurred, the second alternative is selected. When a match does not occur, the first alternative is selected.

Register bank 130 receives phase-4 clock signals. During phase 4, a register 134 addressed by select register 160 is updated. For one embodiment, this involves sending data that is processed by bus controller 142 and held in transfer register 146 to the addressed register 134.

Figures 3, 4, 5:
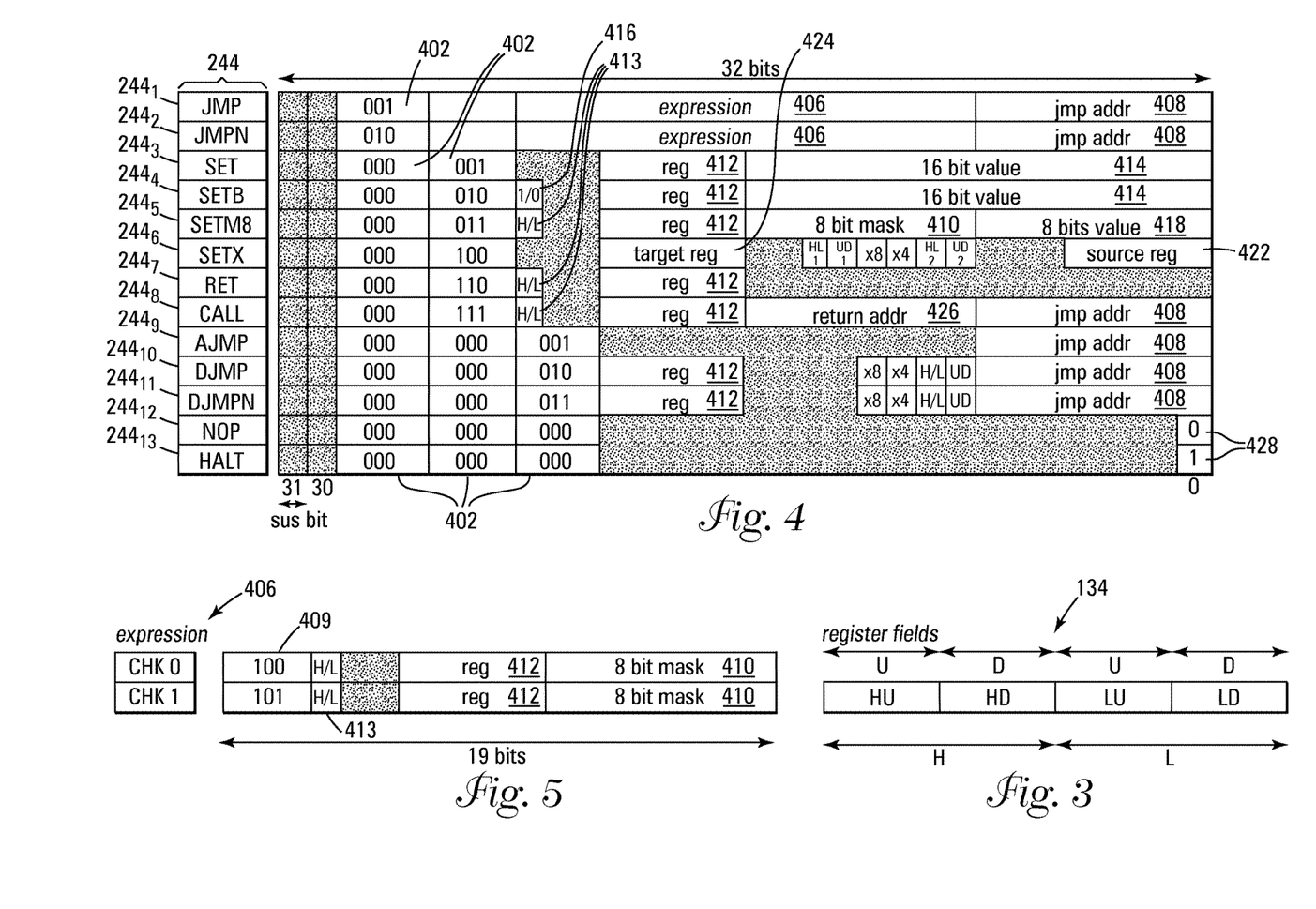
FIG. 3 illustrates register fields for a register of the controller of FIG. 2 according to another embodiment of the present invention.
FIG. 4 illustrates instructions for the controller of FIG. 2 according to another embodiment of the present invention.
FIG. 5 illustrates an expression of one or more of the instructions of FIG. 4 according to another embodiment of the present invention.

FIG. 3 illustrates the register fields for a register 134 of register bank 130 according to another embodiment of the present invention. For one embodiment, register 134 has 16 bits. Data stored in register 134 can be accessed by 16 bits (a word), 8 bits (a byte), or 4 bits (a nibble). For another embodiment, a 16-bit word can be decomposed into an eight-bit high (or H) byte, e.g., a most significant byte, and an eight-bit low (or L) byte, e.g., a least significant byte. For one embodiment, the H-byte includes bits 8-15 of the word and the L-byte bits 0-7. Each byte can be decomposed into a four-bit up (or U) nibble, e.g., a most significant nibble, and a four-bit down (or D) nibble, e.g., a least significant nibble. This means the 16-bit word can be decomposed into a high-up (or HU) nibble, a high-down (or HD) nibble, a low-up (or LU) nibble, and a low-down (or LD) nibble, as shown in FIG. 3. For another embodiment, the HU-nibble includes bits 12-15, the HD-nibble bits 8-11, the LU-nibble bits 4-7, and the LD nibble bits 0-3.

FIG. 4 illustrates instructions $244_1$ to $244_{13}$ according to another embodiment of the present invention. Each of the algorithms stored in code-storage device 178 includes one or more of instructions 244, e.g., arranged in various sequences and/or appearing one or more times. The present invention is not limited to 13 instructions, and in various embodiments, there can be more or fewer than 13 instructions. For one embodiment, each of instructions 244 includes 32 bits, e.g., numbered from 0 to 31. For another embodiment, bit 30 is not used, and bit 31 is a suspension flag. For other embodiments, when bit 31 is set to one (1), the corresponding instruction is suspendable, i.e., the suspension flag is on. For one embodiment, the flags are predetermined and are fixed.

Each of instructions 244 is distinguished by a bit (or operating) code 402, which is fixed for one embodiment. Instruction decoder 166 uses the operating codes 402 to identify the corresponding instruction. Operating codes 402 include 3 to 9 bits, for one embodiment.

Instructions $244_1$ and $244_2$ are conditional jump (JMP and JMPN, respectively) instructions each having an expression 406 and a jumping address (jmp addr) 408. For one embodiment, expression 406 includes 19 bits, and jumping address 408 is eight (8) bits. Instructions $244_1$ and $244_2$ cause execution flow to be changed according to expression 406. For example, when expression 406 of instruction $244_1$ is true or expression 406 of instruction $244_2$ is false, the execution flow jumps to a line (or row) in the algorithm having an address that matches the specified jumping address 408. When expression 406 of instruction $244_1$ is false or expression 406 of instruction $244_2$ is true, the execution flow continues at the next line (or row) in the algorithm.

Specifically, when expression 406 is false, instruction decoder 166 causes program counter over-rider 188 to cause program counter 194 to increment the present of address of code-storage device 178 by one. When expression 406 is true, instruction decoder 166 causes program counter over-rider 188 to cause program counter 194 to be overridden for jumping over a number of addresses of code-storage device 178 to a line of the algorithm corresponding to the specified jumping address 408. That is, program counter over-rider 188 loads the jumping address 408 into program counter 194. The jumping address 408 is sent to code-storage device 178, where code-storage device 178 responds by jumping to the line of the algorithm corresponding to the specified jumping address 408.

FIG. 5 illustrates an expression 406 according to an embodiment of the present invention. For one embodiment, expression 406 can be CHK0 or CHK1. For another embodiment, expression 406 includes a three-bit bit code 409, an eight-bit mask 410, a five-bit register address (reg) 412 for addressing a register of 134 of register bank 130 (e.g., three bits for the page 132 containing the register 134 and two for the register 134), and a bit 413 for specifying the H/L byte of the register 134 corresponding to the register address 412.

For one embodiment, CHK0 is true when the bits of the addressed byte corresponding to mask 410 are all zeros. Otherwise, CHK0 is false. For this embodiment, expression checker 204 indicates a match when the data received from bus controller 142 are all zeros.

For another embodiment, CHK1 is true when the bits of the addressed byte corresponding to mask 410 are all ones. Otherwise, CHK1 is false. For this embodiment, expression checker 204 indicates a match when the data received from bus controller 142 are all ones.

Instruction $244_3$ is a SET instruction having, for one embodiment, register address 412 and a 16-bit value 414. Instruction $244_3$ causes value 414 to be stored in a register 134 corresponding to the register address 412. For one embodiment, value 414 is an initial count used for counting operations.

Instruction $244_4$ is a set binary (SETB) instruction having, for one embodiment, register address 412, value 414, and a 1/0 flag 416. When flag 416 is 0 (zero), only zeros of value 414 are stored in a register 134 corresponding to the register address 412. When flag 416 is 1 (one), only ones of value 414 are stored in the register 134 corresponding to the register address 412. The other bits of the register 134 are left as they are.

Instruction $244_5$ is a set masked by eight (SETM8) instruction having, for one embodiment, register address 412, an eight-bit value 418, mask 410, and bit 413. Instruction $244_5$ causes some of the bits of the addressed byte to be masked and others to be unmasked and causes each unmasked bit to be set to the value of a respective one of the bits of value 418.

Instruction $244_6$ is a transfer (SETX) instruction having, for one embodiment, a five-bit source register address (source reg) 422 and a five-bit target register address (target reg) 424. Instruction $244_6$ causes four, eight, or 16 bits of a register 134 having source register address 422 (e.g., a source register 134) to be loaded into a register 134 having target register address 424 (e.g., a target register 134). For some embodiments, instruction $244_6$ also includes fields for specifying bytes and nibbles of source register 134 and target register 134. HL1 and UD1 in FIG. 4 respectively correspond to a byte and a nibble of source register 134, and HL2 and UD2 respectively correspond to a byte and a nibble of target register 134. Field X4 causes the nibble UD1 (or four bits) of source register 134 to be loaded in nibble UD2 of target register 134. Field X8 causes the byte HL1 (or 8 bits) of source register 134 to be loaded in byte HL2 of target register 134.

Instruction 244₇ is a return (RET) instruction having, for one embodiment, register address 412 and bit 413. Instruction 244₇ causes code-storage device 178 to jump to a line within the algorithm whose address is contained in the register address 412.

Instruction 244₈ is a CALL instruction having, for one embodiment, register address 412, bit 413, jump address 408, and an eight-bit return address 426. Instruction 244₈ causes return address 426 to be stored in the addressed byte (i.e., the H/L byte) of a register 134 having register address 412 and causes the execution flow to jump to a location of code-storage device 178 corresponding to jump address 408.

Instruction 244₉ is an absolute jump (AJMP) instruction having for one embodiment jump address 408. Instruction 244₉ causes the execution flow to jump to a location of code-storage device 178 corresponding to jump address 408. Specifically, program counter over-rider 188 loads the jumping address 408 into program counter 194. The jumping address 408 is sent to code-storage device 178, where code-storage device 178 responds by jumping to the line of the algorithm corresponding to the specified jumping address 408.

Instructions 244₁₀ and 244₁₁ are jumps with decrement (DJMP and DJMPN, respectively) instructions having, for one embodiment, register address 412 and jump address 408. Instructions 244₁₀ and 244₁₁ cause the value of the word, byte, or nibble of the register 134 having register address 412 to be decremented, e.g., by one. Instruction 244₁₀ causes execution flow to jump to a location of code-storage device 178 corresponding to jump address 408 if the result of the decrement is zero. Otherwise, the execution continues at the next location in the algorithm. Instruction 244₁₁ causes execution flow to jump to a location of code-storage device 178 corresponding to jump address 408 if the result of the decrement is not zero. Otherwise, the execution continues at the next location in the algorithm. HL and UD respectively correspond to a byte and a nibble of the register 134 having register address 412. Field X4 specifies a nibble (4 bits) to be decremented. Field X8 specifies that a byte (8 bits) to be decremented. For various embodiments, instructions 244₁₀ and 244₁₁ are used for counting operations. HL selects, depending on its value, the higher or lower byte. UD selects, depending on its value, the higher or lower nibble.

Instructions 244₁₂ and 244₁₃ are respectively no operation (NOP) and HALT instructions. For one embodiment, instructions 244₁₂ and 244₁₃ each has a bit 428 that has a value of 0 (zero) for instruction 244₁₂ and a value of 1 (one) for instruction 244₁₃. For another embodiment, bit 428 is the zeroth numbered bit of the 32 bits. Instruction 244₁₂ causes program counter 194 to be incremented by one, whereas instruction 244₁₃ causes execution flow to stop.

Figure 6:
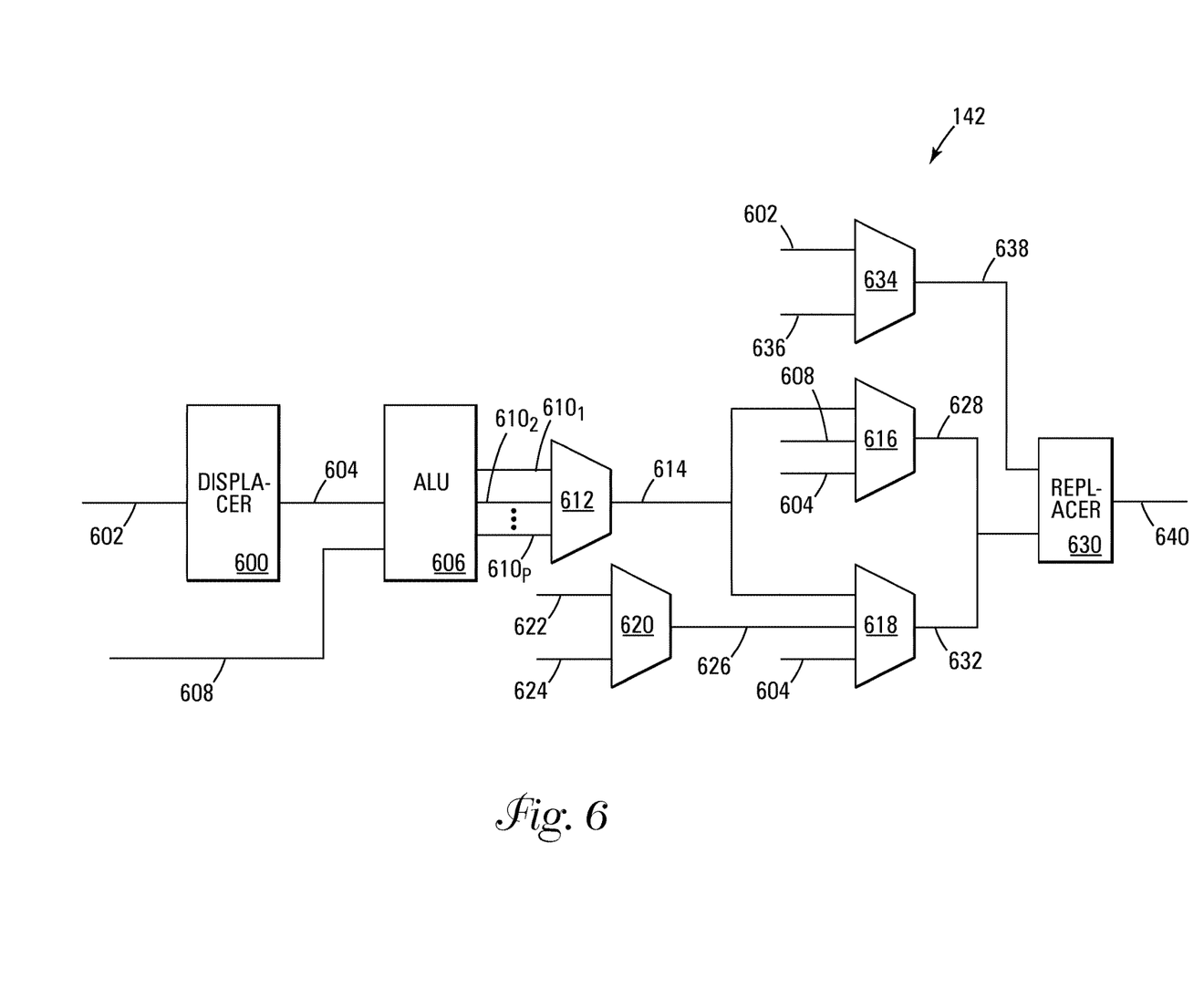
FIG. 6 is a block diagram of a bus controller according to another embodiment of the present invention.

FIG. 6 is a block diagram of bus controller 142 according to another embodiment of the present invention. For one embodiment, bus controller 142 is a combinatorial logic circuit. Bus controller 142 can process data stored in registers 134 of register bank 130 and can provide data to be loaded into registers 134.

For various embodiments, bus controller 142 includes a displacer 600. For one embodiment, displacer 600 receives data 602 from a register 134, e.g., via output bus 136₁, and outputs data 604. Displacer 600 can displace data of 602 contained in one byte or nibble of the data field to another byte or nibble of the data field, e.g., for multiplying or dividing the data. For example, with reference to FIG. 3, data contained in the L byte can be displaced to the H byte and vice versa. Displacer 600 can also pass data 602 without performing any operations on data 602, e.g., without displacing any data.

An arithmetic logic unit (ALU) 606 receives data 604 from displacer 600. Arithmetic logic unit 606 can also receive data 608 from instruction decoder 166. For one embodiment, data 608 includes value 414 or value 418 of the respective instructions 244 of FIG. 4. For another embodiment, arithmetic logic unit 606 decrements data, performs logical AND and/or OR operations on data, masks data, etc. Arithmetic logic unit 606 may perform operations on either data 604 or 608, such as masking and/or decrementing, or perform operations on data 604 and 608 together, such as ANDing or ORing data 604 and 608, masking and/or decrementing the result of the ANDing or ORing, etc.

Arithmetic logic unit 606 sends data 610₁ to 610$_P$ to a multiplexer 612. For one embodiment, data 610₁ to 610$_P$ are the result of different processing operations performed by arithmetic logic unit 606. Multiplexer 612 selects one of data 610₁ to 610$_P$, represented by data 614, and sends the data 614 to multiplexer 616 and/or multiplexer 618.

A multiplexer 620 receives data 622 and 624 from instruction decoder 166. For one embodiment, data 622 is the data contained in bits 8-15 of value 414 the respective instruction of FIG. 4, and data 624 is the data contained in bits 0-7 of the value 414. In response to an instruction received from instruction decoder 166, multiplexer 620 selects either data 622 or 624, represented by data 626, and sends the data 626 to multiplexer 618. For one embodiment, multiplexer 618 also receives data 614 from displacer 600. For another embodiment, multiplexer 616 receives data 614 from displacer 600 and data 608 from instruction decoder 166. In response to an instruction received from instruction decoder 166, multiplexer 616 selects one of data 604, 608, and, 614, represented by data 628, and sends data 628 to a replacer 630. Multiplexer 618 selects one of data 604, 614, and 626, represented by data 632, and sends data 632 to replacer 630 in response to an instruction received from instruction decoder 166. For another embodiment, data 628 or data 632 is sent to replacer 630.

A multiplexer 634 receives data 602 and data 636 from different registers 134, e.g., respectively via output buses 136₁ and 136₂. Multiplexer 634 selects one of data 602 and 636, represented by data 638, and sends data 638 to replacer 630 in response to an instruction received from instruction decoder 166. Replacer 630 outputs data 640 and/or performs operations on data 640 in response to instructions received from instruction decoder 166. For one embodiment, replacer passes data 628, 632, or 638 as is, e.g., without performing any operations on the respective data. For another embodiment, replacer 630 creates data 640, for example, using nibbles from data 628 and 638, from data 628 and 632, from data 632 and 638, or from data 628, 632, and 638. Replacer 640 sends data 640 to one of registers 134 via input bus 154.

Figure 7:
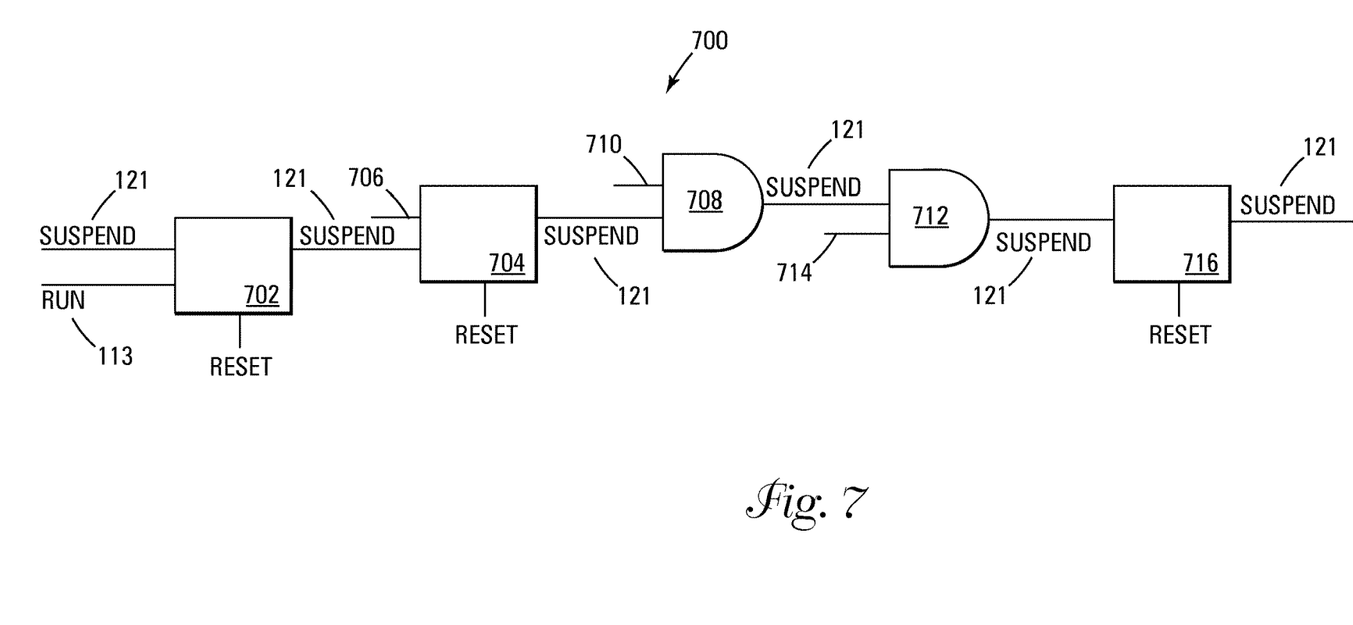
FIG. 7 is a block diagram of a suspension controller according to another embodiment of the present invention.

For one embodiment, asynchronous controller interface 214 includes a suspension controller 700, illustrated in FIG. 7. Suspension controller 700 acts to synchronize suspend command 121, which is asynchronous with respect to clock generator 156. Suspend command 121 is asynchronous in that it can be received at micro-programmable controller 110 at anytime, i.e., during any phase of clock generator 156. However, for various embodiments, it is desirable that the suspend command 121 is executed during a particular phase of clock generator 156.

Suspend command 121 is received at a latch 702, such as a D-latch, of suspension controller 700. Suspend command 121 is held in latch 702 as long as run command 113 is active. For one embodiment, suspend command 121 is held in latch 702 because subsequent user commands can cause suspend command 121 to be erased if suspend command 121 is not held in latch 702. When a signal 706, such as a phase 2 signal of clock generator 156, is received at a latch 704, such as a D-latch, suspend command 121 is sent to an AND gate 708.

When signal 710 is logic high at AND gate 708, suspend command 121 is sent to an AND gate 712. For one embodiment, signal 710 is sent when the suspension flag of an instruction 244 that is addressed is on, i.e., bit 31 of the addressed instruction is set to one (1). This means that suspend command 121 is held until a suspendable instruction 244 is addressed. When a signal 714, such as a phase-3 signal of clock generator 156, is logic high at AND gate 712, suspend command 121 is sent to a latch 716, such as a D-latch. Suspend command 121 is then sent from latch 716 to instruction decoder 166 for interpretation and execution. For one embodiment, latch 716 enables suspend command 121 to be removed (or disabled) by resetting latch 716. For other embodiments, latches 702, 704, and 716 are reset substantially simultaneously in response to a reset signal.

For one embodiment, micro-programmable controller 110 operates as a counter as follows: During phase 1 of clock generator 156, program counter 194 sends an address to code storage device 178, where the address corresponds to a line of an algorithm of code storage device 178 that contains a first instruction having an initial count, such as value 414 of instruction $244_3$ of FIG. 4. Then, program counter 194 is incremented by one. During phase 2 of clock generator 156, code storage device 178 sends the first instruction to instruction register 172, where the first instruction is held until phase 3 of clock generator 156. During phase 3, the first instruction is sent to instruction decoder 166. Instruction decoder 166 interprets the first instruction and sends a first signal to select register 160, where the first signal corresponds to an address of a first register 134 in which the initial count will be stored. Upon receiving the first signal, select register selects the first register 134. Instruction decoder 166 also sends a second signal to bus controller 142, where the second signal corresponds to the initial count. Bus controller 142 sends the initial count to transfer register 146. During phase 4 of clock generator 156, transfer register 146 sends the initial count to the first register 134. This completes one operating cycle (e.g., including the four phases) of micro-programmable controller 110.

During phase 1 of the next operating cycle, program counter 194 sends an address corresponding to a line of the algorithm of code storage device 178 that contains a second instruction for decrementing the initial count by one, such as instruction $244_{10}$ of FIG. 4. Then, program counter 194 is incremented by one. During phase 2, code storage device 178 sends the second instruction to instruction register 172, where the second instruction is held until phase 3. During phase 3, the second instruction is sent to instruction decoder 166. Instruction decoder 166 interprets the second instruction and sends a third signal to select register 160, where the third signal corresponds to the address of the first register 134 in which the initial count is stored. Upon receiving the third signal, select register 160 selects the first register 134 and the initial count is sent to bus controller 142. Instruction decoder 166 also sends a fourth signal to bus controller 142 that causes bus controller 142 to decrement the initial count by one to form a second count. Bus controller 142 sends the second count to transfer register 146 and to expression checker 204.

Expression checker 204, for one embodiment, compares the second count to zero. When the second count is zero, expression checker 204 sends a first match signal, indicative of a match, to expression decoder 166. In response to receiving the first match signal, expression decoder 166 sends a fifth signal, corresponding to a jump address included in the second instruction, to over-rider 188. For various embodiments, the jump address corresponds to a line of the algorithm of code storage device 178 that terminates counting. Transfer register 146 then sends the second count to the first register 134 or a second register 134 during phase 4. When the second count is not zero, transfer register 146 sends the second count to the first register 134 or the second register 134 during phase 4, and the above process repeats until the count is zero.

For some embodiments, an actuator signal is sent, e.g., from a third register 134, to analog/memory core 116 during each operating cycle, e.g., during phase 3 before the second count is sent to the first or second register. For one embodiment, the initial count corresponds to a number of voltage pulses to be applied to the memory cells, and the actuator causes one or more voltage circuits of analog/memory core 116 to send the voltage pulse to the memory cells. In this way, micro-programmable controller 110 acts as a pulse counter.

For another embodiment, the above counting method is used as an address counter for selecting and keeping track of addresses of analog/memory core 116, e.g. addresses of individual memory cells, rows of an array of the memory cells, etc. In this embodiment, an actuator signal containing an address of analog/memory core 116 is sent, e.g., from a third register 134, during each operating cycle to analog/memory core 116, e.g., during phase 3 before the second count is sent to the first or second register. During each operating cycle, the address is incremented. For one embodiment, the address is incremented by sending the address from one of registers 134 to bus controller 142. Bus controller 142 increments the address and sends the incremented address to the same or another one of registers 134.

It is apparent that the initial count corresponds to a number of cycles executed by micro-programmable controller 110. Moreover, each cycle is executed during a cycle time. Therefore, the initial count can correspond to a time, e.g., the time it takes to execute the number of operating cycles corresponding to the initial count. For one embodiment, at a start of a count, an actuator signal is sent, e.g., from a third register 134, to analog/memory core 116 for activating a voltage pulse in the memory core. At the end of the count, e.g., when the initial count is counted down to zero, another actuator signal is sent, e.g., from a fourth register 134, to analog/memory core 116 for deactivating the voltage pulse. In this way, the voltage pulse is applied for the time it takes to execute the number of operating cycles corresponding to the initial count and thus micro-programmable controller 110 can be used as a pulse duration counter.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
   a memory core comprising an array of memory cells;
   a register bank coupled to the memory core;
   a select register having an output coupled to the register bank, and an input;
   a controller having a first input coupled to the register bank, and a second input different from the first input; and
   non-volatile memory coupled to the input of the select register and to the second input of the controller;
   wherein the controller, in cooperation with the select register, is configured to write data received at the controller from the non-volatile memory into a register of the register bank identified by the select register;
   wherein the controller, in cooperation with the select register, is further configured to write data received at the controller from a source register of the register bank identified by the select register to a target register of the register bank identified by the select register; and
   wherein the register bank stores actuators that cause operations to be performed on the memory core.

2. The memory device of claim 1, wherein the controller is configured to change a value of an actuator.

3. The memory device of claim 2, wherein the controller is configured to change the value of the actuator in response to an instruction from the non-volatile memory.

4. The memory device of claim 1, wherein the non-volatile memory comprises mask programmable memory cells.

5. The memory device of claim 1, wherein the controller comprises a displacer, and wherein the displacer has an input coupled to the first input of the controller.

6. The memory device of claim 5, wherein the displacer is configured to displace data contained in one portion of a data field received from the register bank to another portion of the data field.

7. The memory device of claim 5, wherein the controller comprises an arithmetic logic unit, and wherein the arithmetic logic unit comprises a first input coupled to the displacer and a second input coupled to the second input of the controller.

8. The memory device of claim 7, wherein the arithmetic logic unit is configured to change a value of data from the non-volatile memory and/or data from the displacer.

9. A memory device, comprising:
   a memory core comprising an array of memory cells;
   a register bank coupled to the memory core;
   a controller coupled to the register bank; and
   non-volatile memory coupled to the controller;
   wherein the controller is configured to write outputs from the non-volatile memory into the register bank;
   wherein the register bank stores actuators that cause operations to be performed on the memory core;
   wherein the controller comprises a displacer having an input coupled to the register bank;
   wherein the controller comprises an arithmetic logic unit having inputs coupled to the displacer and the non-volatile memory; and
   wherein the controller comprises a replacer having an output coupled to the register bank and inputs selectively coupled to the displacer, the register bank, the arithmetic logic unit, and the non-volatile memory.

10. The memory device of claim 9, wherein the replacer is configured to create data from portions of data selectively received from the displacer, the register bank, the arithmetic logic unit, and/or the non-volatile memory.

11. The memory device of claim 1, further comprising an expression checker coupled to the controller and configured to determine whether data contained in an instruction contained in the non-volatile memory has a particular value.

12. The memory device of claim 1, further comprising an instruction decoder, wherein the non-volatile memory is coupled to the select register through the instruction decoder, and is coupled to the controller through the instruction decoder.

13. The memory device of claim 12, wherein the data received from the non-volatile memory are received at the controller through the instruction decoder.

14. The memory device of claim 13, wherein the data received from the non-volatile memory that are received at the controller through the instruction decoder are contained in instructions received at the instruction decoder from the non-volatile memory.

15. The memory device of claim 14, wherein the instruction decoder is configured to output the data contained in the instructions to the controller in response to the instructions.

16. The memory device of claim 14, wherein the instructions contain addresses of registers in the register bank into which the data received from the non-volatile memory are to be written.

17. The memory device of claim 12, further comprising an asynchronous controller interface coupled to the instruction decoder, wherein the asynchronous controller interface is configured a receive a command during any operating cycle of the memory device and to send the command to the instruction decoder during a particular operating cycle of the memory device.

18. The memory device of claim 12, further comprising an instruction register coupled between the non-volatile memory and the instruction decoder, the instruction register configured to receive an instruction from the non-volatile memory and to hold the instruction for a certain time before sending the instruction to the instruction decoder.

19. The memory device of claim 12, further comprising an expression checker coupled to the controller and the instruction decoder, wherein the expression checker is configured to indicate to the instruction decoder whether data from the controller has a certain value.

20. A memory device, comprising:
   a memory core comprising an array of memory cells;
   a register bank coupled to the memory core;
   a controller coupled to the register bank;
   non-volatile memory coupled to the controller;
   an instruction decoder, wherein the non-volatile memory is coupled to the controller through the instruction decoder; and
   an expression checker coupled to the controller and the instruction decoder, wherein the expression checker is configured to indicate to the instruction decoder whether data from the controller has a certain value;
   wherein the controller is configured to write outputs from the non-volatile memory into the register bank;
   wherein the register bank stores actuators that cause operations to be performed on the memory core;
   wherein the instruction decoder is configured to output a control signal that causes an address in the non-volatile memory to be incremented by one in response to the data from the controller not having the certain value and to be incremented by more than one in response to the data from the controller having the certain value.

21. The memory device of claim 12, wherein the select register is configured to select a register within the register bank in response to a signal from the instruction decoder.

22. A method of operating a flash memory, comprising:
sending an actuator to a memory core from a first register of a register bank in response to a first instruction, specifying the first register, of an algorithm contained in a code storage device, the actuator causing an operation to be performed on the memory core;
receiving data at a first input of a controller in response to a second instruction of the algorithm, wherein the data received at the first input of the controller in response to the second instruction of the algorithm is stored in the code storage device and is received from the code storage device, and wherein the controller has a second input, different from the first input, coupled to the register bank;
loading the data received at the controller from the code storage device into a second register of the register bank in response to the second instruction of the algorithm, wherein the second register is specified in the second instruction;
receiving data at the second input of the controller in response to a third instruction of the algorithm, wherein the data received at the second input of the controller in response to the third instruction of the algorithm is stored in a source register of the register bank, wherein the source register is specified in the third instruction; and
loading the data received at the second input of the controller in response to the third instruction of the algorithm into a target register of the register bank in response to the third instruction of the algorithm, wherein the target register is specified in the third instruction.

23. A method of operating a flash memory, comprising:
sending an actuator to a memory core from a first register of a register bank in response to a first instruction, specifying the first register, of an algorithm contained in a code storage device, the actuator causing an operation to be performed on the memory core;
loading data contained in a second instruction of the algorithm into a second register of the register bank, wherein the second register is specified in the second instruction;
addressing the first and second instructions contained in the code storage device during first clock phase of an operating cycle of the flash memory; and
enabling the code storage device during a second clock phase of the operating cycle that occurs after the first clock phase;
wherein sending the actuator to the memory core from the first register occurs during a third clock phase of the operating cycle that occurs after the second clock phase, and wherein loading the data contained in the second instruction of the algorithm into the second register occurs during a fourth clock phase of the operating cycle that occurs after the third clock phase.

24. A method of operating a flash memory, comprising:
sending an actuator to a memory core from a first register of a register bank in response to a first instruction, specifying the first register, of an algorithm contained in a code storage device, the actuator causing an operation to be performed on the memory core;
loading data contained in a second instruction of the algorithm into a second register of the register bank, wherein the second register is specified in the second instruction;
addressing the first and second instructions contained in the code storage device during a first clock phase of an operating cycle of the flash memory; and
storing signals from the memory core in a third register of the register bank during a second clock phase of the operating cycle that occurs after the first clock phase;
wherein sending the actuator to the memory core from the first register occurs during a third clock phase of the operating cycle that occurs after the second clock phase, and wherein loading the data contained in the second instruction of the algorithm into the second register occurs during a fourth clock phase of the operating cycle that occurs after the third clock phase.

25. The method of claim 22, further comprising:
receiving data at the second input of the controller from the second register;
changing a value of the data received at the second input of the controller from the second register; and
loading the changed value of the data received at the second input of the controller from the second register into the second register or into a third register of the register bank.

* * * * *

UNITED STATES PATENT AND TRADEMARK OFFICE
CERTIFICATE OF CORRECTION

PATENT NO. : 10,049,038 B2
APPLICATION NO. : 14/809959
DATED : August 14, 2018
INVENTOR(S) : De Santis et al.

It is certified that error appears in the above-identified patent and that said Letters Patent is hereby corrected as shown below:

In the Claims

Column 14, Claim 17, Line 33, delete "configured a receive a command" and insert in place thereof --configured to receive a command--.

Signed and Sealed this
Eighteenth Day of December, 2018

Andrei Iancu
*Director of the United States Patent and Trademark Office*